United States Patent
Hou

(10) Patent No.: US 7,944,705 B2
(45) Date of Patent: May 17, 2011

(54) COMPATIBLE CIRCUIT FOR INTEGRATED CIRCUITS AND LAYOUT METHOD FOR THE SAME

(75) Inventor: Chuan-Tsai Hou, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 537 days.

(21) Appl. No.: 11/947,776

(22) Filed: Nov. 30, 2007

(65) Prior Publication Data

US 2008/0253099 A1 Oct. 16, 2008

(30) Foreign Application Priority Data

Apr. 13, 2007 (CN) .......................... 2007 1 0200455

(51) Int. Cl.
*H05K 7/00* (2006.01)
(52) U.S. Cl. ........................................ 361/760; 361/782
(58) Field of Classification Search .................. 361/760, 361/761, 782; 257/778, 706
See application file for complete search history.

(56) References Cited

U.S. PATENT DOCUMENTS

| 6,384,346 | B1 | 5/2002 | Chang et al. | |
|---|---|---|---|---|
| 2003/0034564 | A1* | 2/2003 | Palanisamy et al. | 257/778 |
| 2005/0127501 | A1* | 6/2005 | Khan et al. | 257/706 |
| 2008/0151514 | A1* | 6/2008 | Yancey | 361/761 |
| 2008/0247115 | A1* | 10/2008 | Lee et al. | 361/277 |
| 2009/0059546 | A1* | 3/2009 | Xing | 361/782 |

FOREIGN PATENT DOCUMENTS

JP 9-293757 A 11/1997
* cited by examiner

*Primary Examiner* — Jeremy C. Norris
*Assistant Examiner* — Yuriy Semenenko
(74) *Attorney, Agent, or Firm* — Frank R. Niranjan

(57) ABSTRACT

A compatible circuit for integrated circuits (ICs) includes three input terminals coupled to corresponding pins of an IC, and three function terminals corresponding to the three input terminals. Each input terminal coupled to the three function terminals via three transmission lines, each transmission line has an open segment, and each input terminal is electrically coupled to a corresponding function terminal by selectively mounting a connection component on the open segment of the corresponding transmission line according to a specification of the IC.

4 Claims, 1 Drawing Sheet

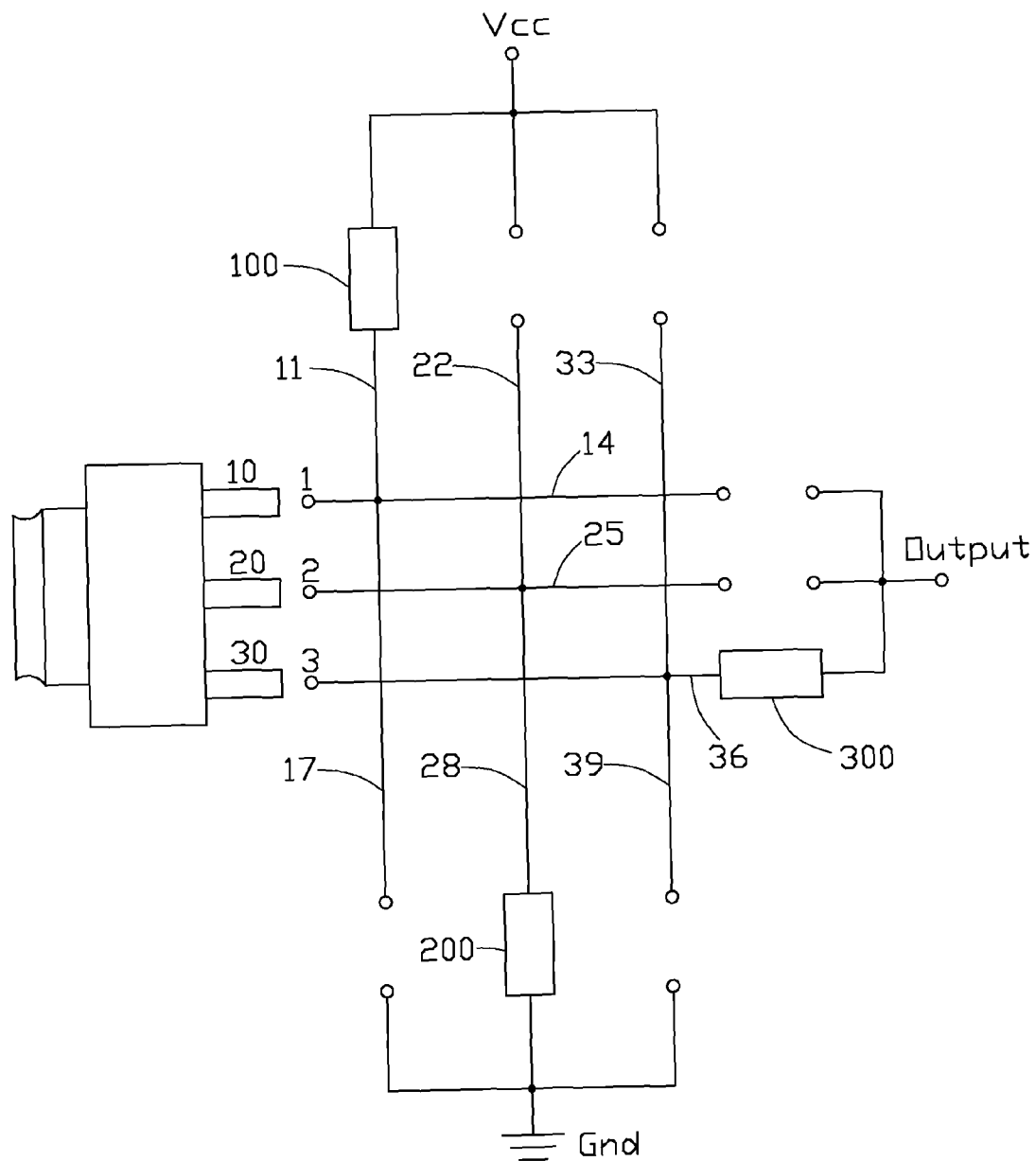

COMPATIBLE CIRCUIT FOR INTEGRATED CIRCUITS AND LAYOUT METHOD FOR THE SAME

BACKGROUND

1. Field of the Invention

The present invention relates to compatible circuits for integrated circuits (ICs), and particularly to a compatible circuit which is compatible with ICs of different specifications on a motherboard.

2. Description of Related Art

A pad on a Printed Circuit Board (PCB) is usually corresponding to an IC with a special specification. A SOT-223 packaged voltage regulator produced by AME, inc. in Taiwan is provided as an example, the SOT-223 packaged regulator has two types of specifications. ICs are mounted on special positions of the PCB in production of a motherboard. Sometimes one type of IC has to be replaced by another type of IC because of a shortage of the ICs, and the replacement ICs cannot match the pads on the PCB, thereby forcing adjusting the layout of the PCB, which will increase costs of production.

What is needed, therefore, is to provide a compatible circuit which is compatible with ICs of different specifications.

SUMMARY

An exemplary compatible circuit for integrated circuits (ICs) includes three input terminals coupled to corresponding pins of an IC, and three function terminals corresponding to the three input terminals. Each input terminal coupled to the three function terminals via three transmission lines, each transmission line has an open segment, and each input terminal is electrically coupled to a corresponding function terminal by selectively mounting a connection component on the open segment of the corresponding transmission line according to a specification of the IC.

Other advantages and novel features of the present invention will become more apparent from the following detailed description of preferred embodiment when taken in conjunction with the accompanying drawing, in which:

BRIEF DESCRIPTION OF THE DRAWING

The drawing is a circuit diagram of one embodiment of a compatible circuit for ICs in accordance with the present invention.

DETAILED DESCRIPTION

Referring to the drawing, a compatible circuit for ICs in accordance with an embodiment of the present invention includes a first input terminal 1, a second input terminal 2, and a third input terminal 3. The first input terminal 1 is connected to a first function terminal Vcc, a second function terminal Output, and a third function terminal Gnd respectively via a first transmission line 11, a fourth transmission line 14, and a seventh transmission line 17. The second input terminal 2 is connected to the first function terminal Vcc, the second function terminal Output, and the third function terminal Gnd respectively via a second transmission line 22, a fifth transmission line 25, and an eighth transmission line 28. The third input terminal 3 is connected to the first function terminal Vcc, the second function terminal Output, and the third function terminal Gnd respectively via a third transmission line 33, a sixth transmission line 36, and a ninth transmission line 39. The first function terminal Vcc, the second function terminal Output, and the third function terminal Gnd are respectively acting as a power supply terminal, an output terminal, and a ground terminal. Each transmission line has an open segment, and each input terminal is electrically coupled to a corresponding function terminal by selectively mounting a connection component on the open segment of the corresponding transmission line according to a specification of the IC.

When a transmission line is an open circuit, the corresponding input terminal and function terminal coupled by the transmission line are not connected. When connecting the open circuit with the connection component, the corresponding input terminal and function terminal coupled by the transmission line are connected. Therefore the function terminals can match ICs of different specifications by connecting the connection components on corresponding transmission lines.

In this embodiment, the IC is a SOT-223 packaged voltage regulator produced by AME, inc. in Taiwan. The SOT-223 packaged voltage regulator has two types of specifications: AME8815AEGT with pins 10, 20, 30 which are respectively an input pin, a ground pin, and an output pin, and AME8815BEGT with pins 10, 20, 30 which are respectively a ground pin, an output pin, and an input pin. When the voltage regulator mounted on a Printed Circuit Board (PCB) is an AME8815AEGT type, the first input terminal 1, the second input terminal 2, and the third input terminal 3 are respectively connected to the input pin 10, the ground pin 20, and the output pin 30 of the voltage regulator, by setting connection components 100, 200, 300 on the transmission lines 11, 28, 36, and leaving the other transmission lines open. When the voltage regulator mounted on the PCB is an AME8815BEGT type, the first input terminal 1, the second input terminal 2, and the third input terminal 3 are respectively connected to the ground pin 10, the output pin 20, and the input pin 30 of the voltage regulator, by setting the connection components on the transmission lines 17, 25, 33, and leaving the other transmission lines open. When the voltage regulator mounted on the PCB is another type of IC with pins 10, 20, 30 being respectively an output pin, an input pin, and a ground pin, the first input terminal 1, the second input terminal 2, and the third input terminal 3 are respectively connected to the output pin 10, the input pin 20, and the ground pin 30 of the voltage regulator, by setting connection components on the transmission lines 14, 22, 39, and leaving the other transmission lines open. In this embodiment, the connection components are resistors.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A compatible circuit for different types of integrated circuits (ICs), comprising:

three input terminals configured for coupling with an input pin, a ground pin, and an output pin of an IC when the IC is plugged in the compatible circuit;

three function terminals comprising a power supply terminal, a ground terminal, and an output terminal corresponding to the three input terminals; and a plurality of transmission lines coupled between each input terminal and the three function terminals, each transmission line having an open segment, each input terminal electrically coupled to a corresponding function terminal by selectively mounting a connection component on the open segment of the corresponding transmission line according to a specification of the IC, thereby compatible with different types of ICs.

2. The compatible circuit for different types of ICs as claimed in claim 1, wherein the connection components are resistors.

3. A layout method of a compatible circuit for mounting different types of ICs on a Printed Circuit Board (PCB) comprising the steps of:

providing three input terminals coupled with an input pin, a ground pin, and an output pin of an IC, and three function terminals comprising a power supply terminal, a ground terminal, and an output terminal corresponding to the three input terminals on the PCB; and setting a plurality of transmission lines coupled between each input terminal and the three function terminals, each transmission line having an open segment, each input terminal electrically coupled to a corresponding function terminal by selectively mounting a connection component on the open segment of the corresponding transmission line according to a specification of the IC.

4. The layout method as claimed in claim 3, wherein the connection components are resistors.

* * * * *